(12) United States Patent
Chesavage

(10) Patent No.: US 6,757,350 B1
(45) Date of Patent: Jun. 29, 2004

(54) REDUNDANT CLOCK GENERATION AND DISTRIBUTION

(75) Inventor: Jay A. Chesavage, Palo Alto, CA (US)

(73) Assignee: Cisco Technology, Inc.

( * ) Notice: Subject to any disclaimer, the term of this patent is extended or adjusted under 35 U.S.C. 154(b) by 0 days.

(21) Appl. No.: 09/332,204

(22) Filed: Jun. 12, 1999

(51) Int. Cl.[7] .................................................. H03D 3/24
(52) U.S. Cl. ............................................................ 375/376
(58) Field of Search ................................. 375/376, 375, 375/371, 215, 327, 294, 373; 329/325, 360; 327/147, 156

(56) References Cited

U.S. PATENT DOCUMENTS

| 4,239,982 | A | * | 12/1980 | Smith et al. ................. 327/297 |
|---|---|---|---|---|
| 4,282,493 | A |  | 8/1981 | Moreau |
| 4,779,008 | A |  | 10/1988 | Kessels |
| 5,036,528 | A |  | 7/1991 | Le et al. |
| 5,295,258 | A |  | 3/1994 | Jewett et al. |
| 5,355,090 | A |  | 10/1994 | Pajowski et al. |
| 5,371,764 | A |  | 12/1994 | Gillingham et al. |
| 5,422,915 | A |  | 6/1995 | Byers et al. |
| 5,510,397 | A |  | 4/1996 | Okuda et al. |
| 5,537,583 | A |  | 7/1996 | Truong |
| 5,557,623 | A |  | 9/1996 | Discoll |
| 5,642,069 | A |  | 6/1997 | Waite |
| 6,194,969 | B1 | * | 2/2001 | Doblar ........................... 331/2 |
| 6,204,732 | B1 | * | 3/2001 | Rapoport et al. ............ 375/376 |
| 6,239,626 | B1 | * | 5/2001 | Chesavage .................... 327/99 |
| 6,516,422 | B1 | * | 2/2003 | Doblar et al. ............... 713/503 |

* cited by examiner

*Primary Examiner*—Khai Tran
(74) *Attorney, Agent, or Firm*—Jay A. Chesavage

(57) ABSTRACT

A system for the generation and distribution a plurality of coherently phased system clocks comprises a local clock generator and a plurality of remote clock generators. Each clock generator has a local input and a plurality of remote inputs coupled to a plurality of phase detectors, a cost function coupled to each phase detector and producing a control output, and the control output coupled to a voltage controlled oscillator and producing a local clock output, which is distributed to each local and remote clock generator. The cost function comprises a linear and non-linear combination of phase error and offset. A clock selection circuit comprises a control input which changes a propagation time away from the coherently phased edges of the system clock, thereby selecting a system clock in a glitch-free manner.

22 Claims, 5 Drawing Sheets

Cost Function Clock Generation

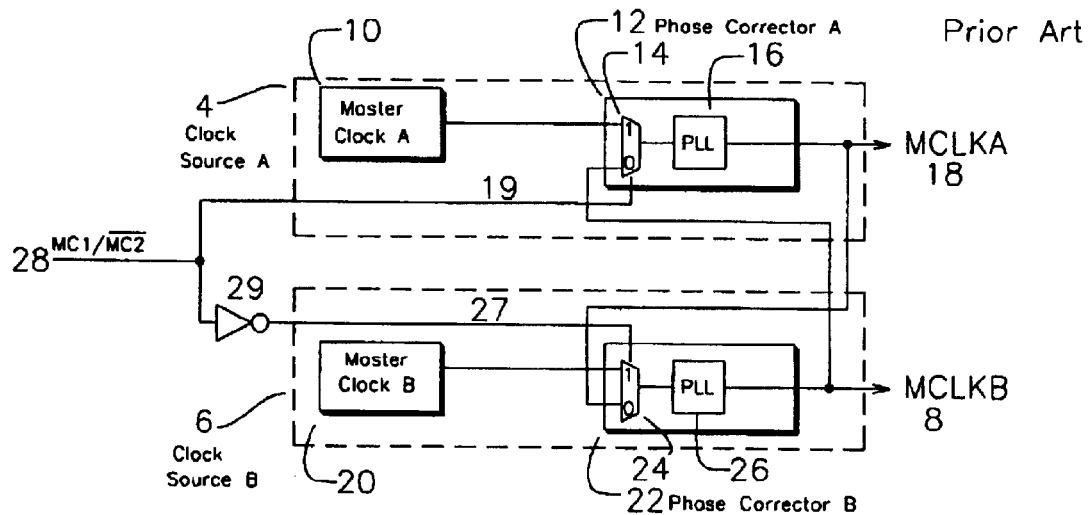
Figure 1: Master/Slave Clock Generation
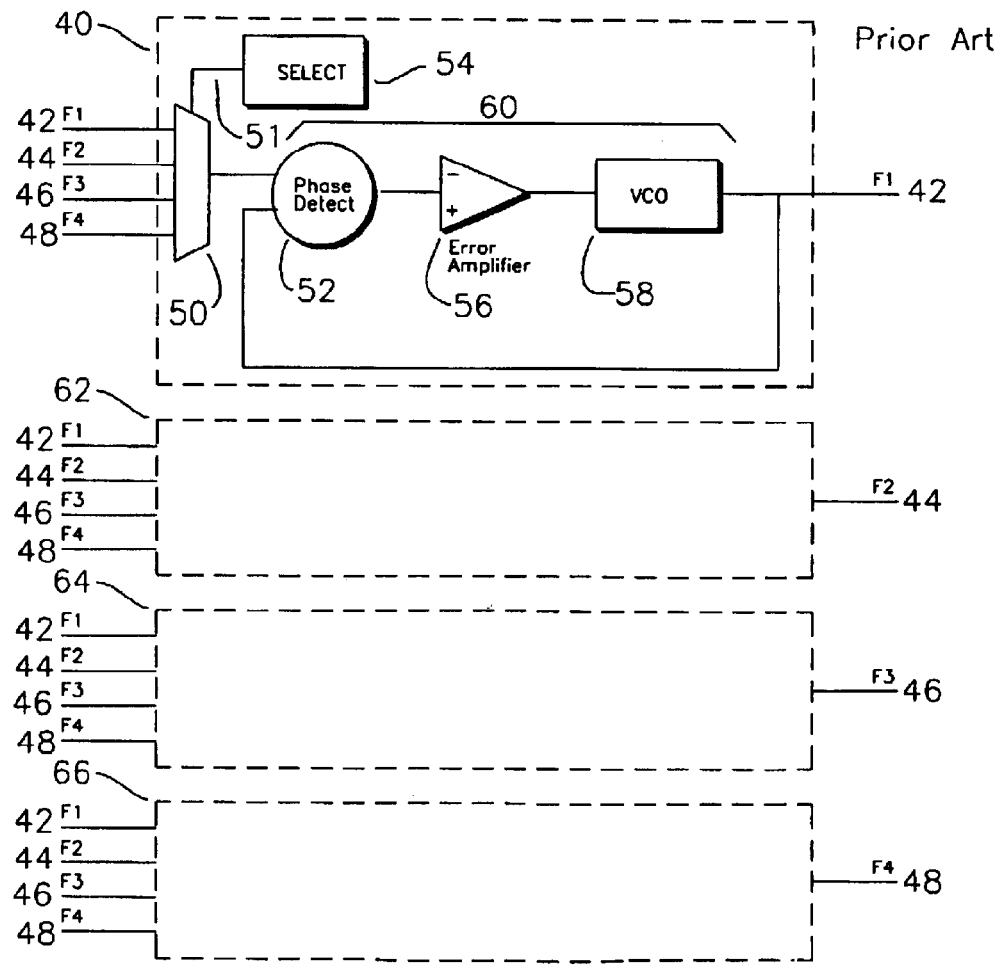
Figure 2: Frequency Averaging Clock Generation Figure 3: Cost Function Clock Generation
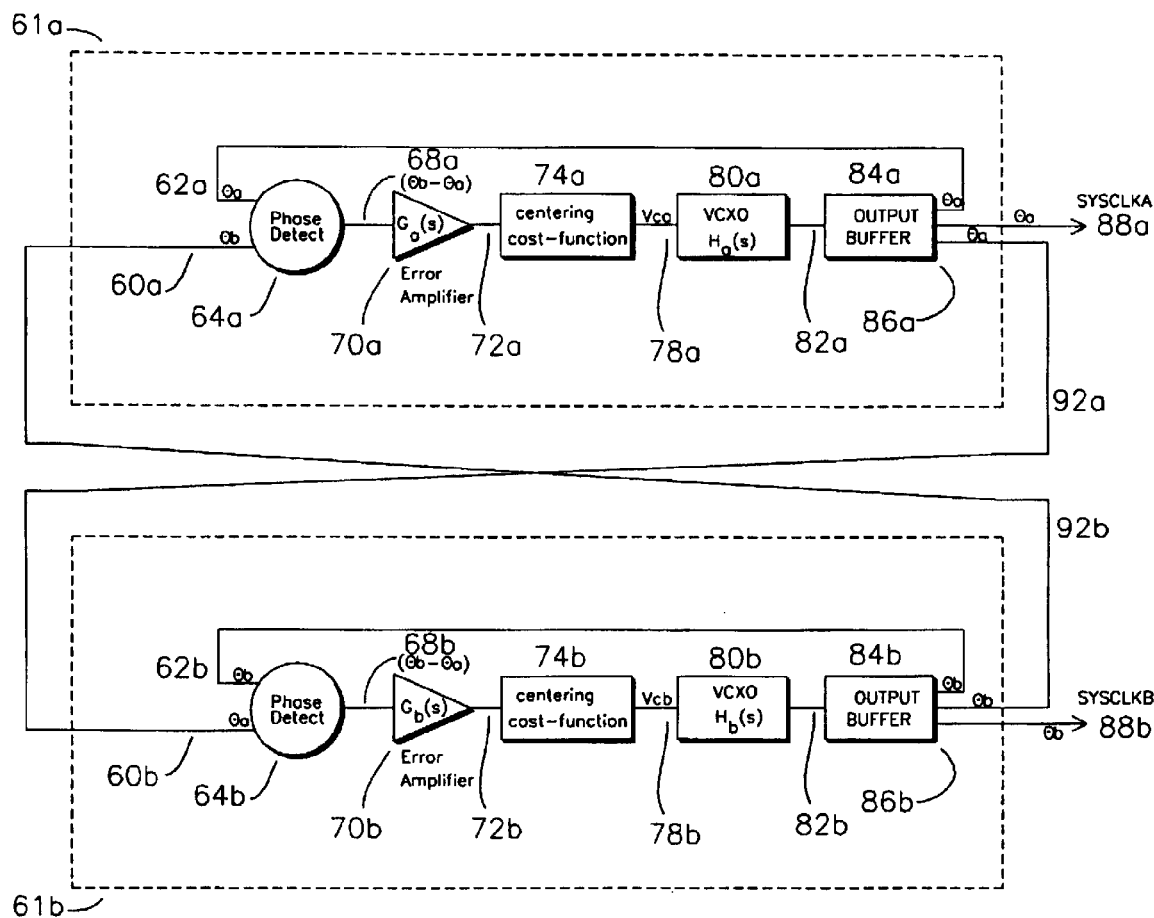
Figure 4: Cost Function
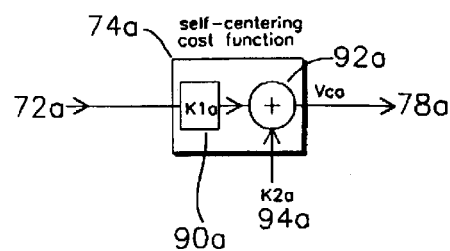

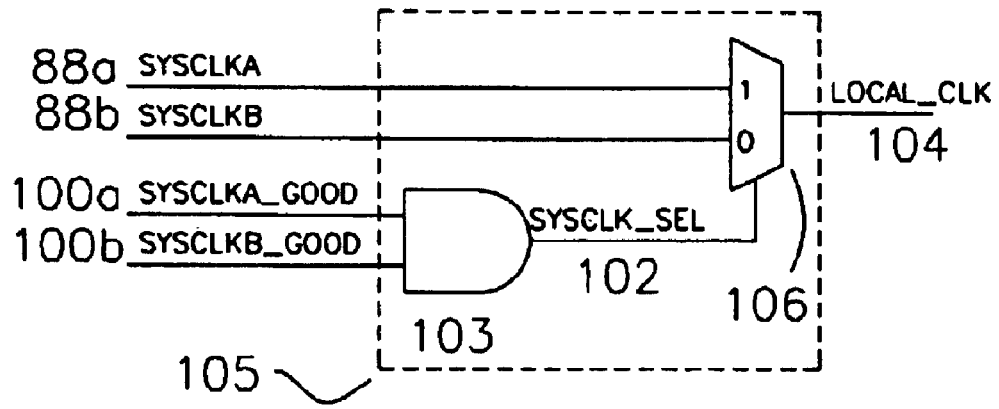
Figure 5: Clock Select
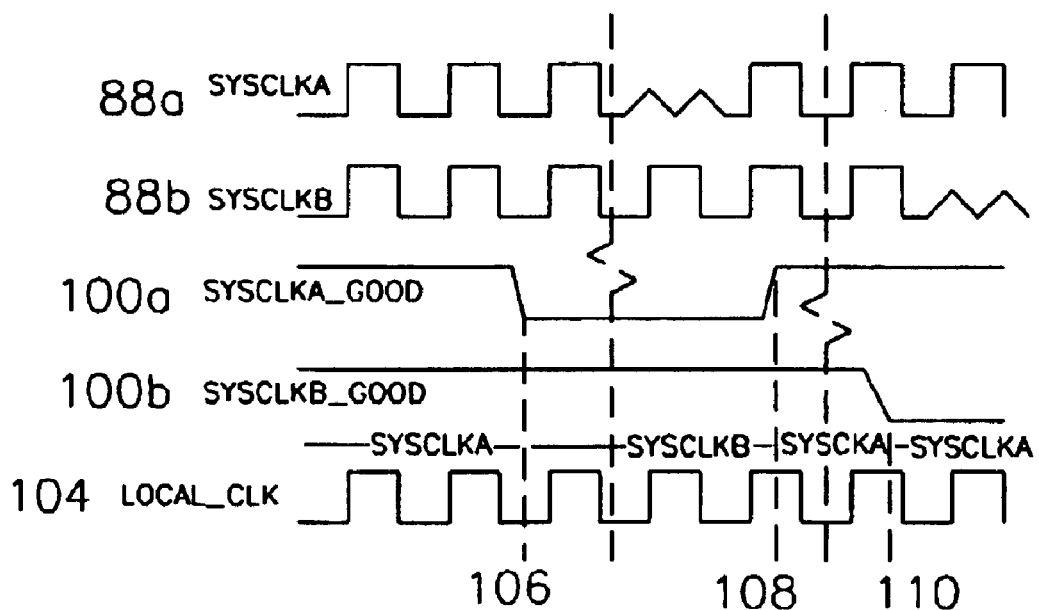
Figure 6: Select Timing

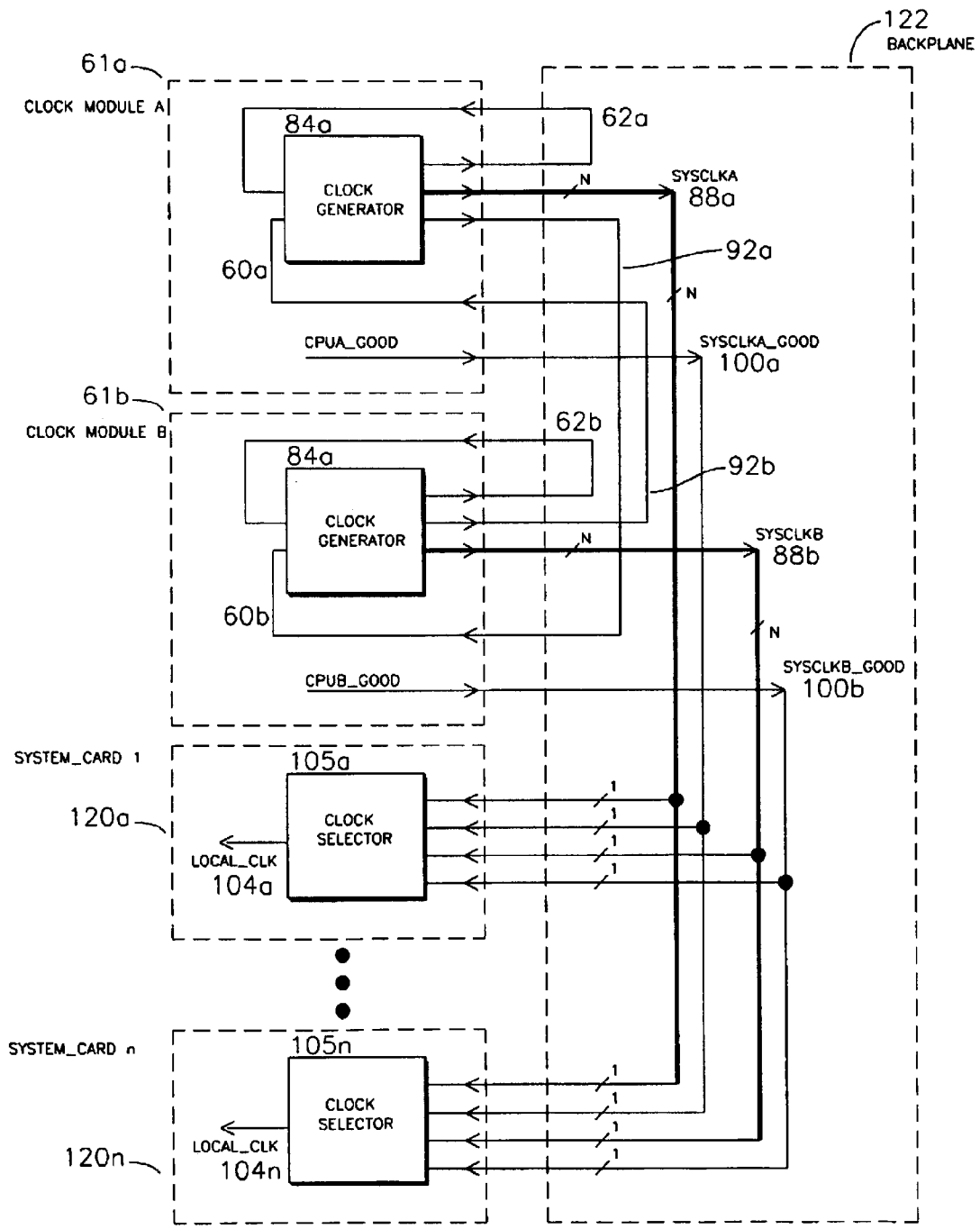
Figure 7: Clock Distribution in a Backplane

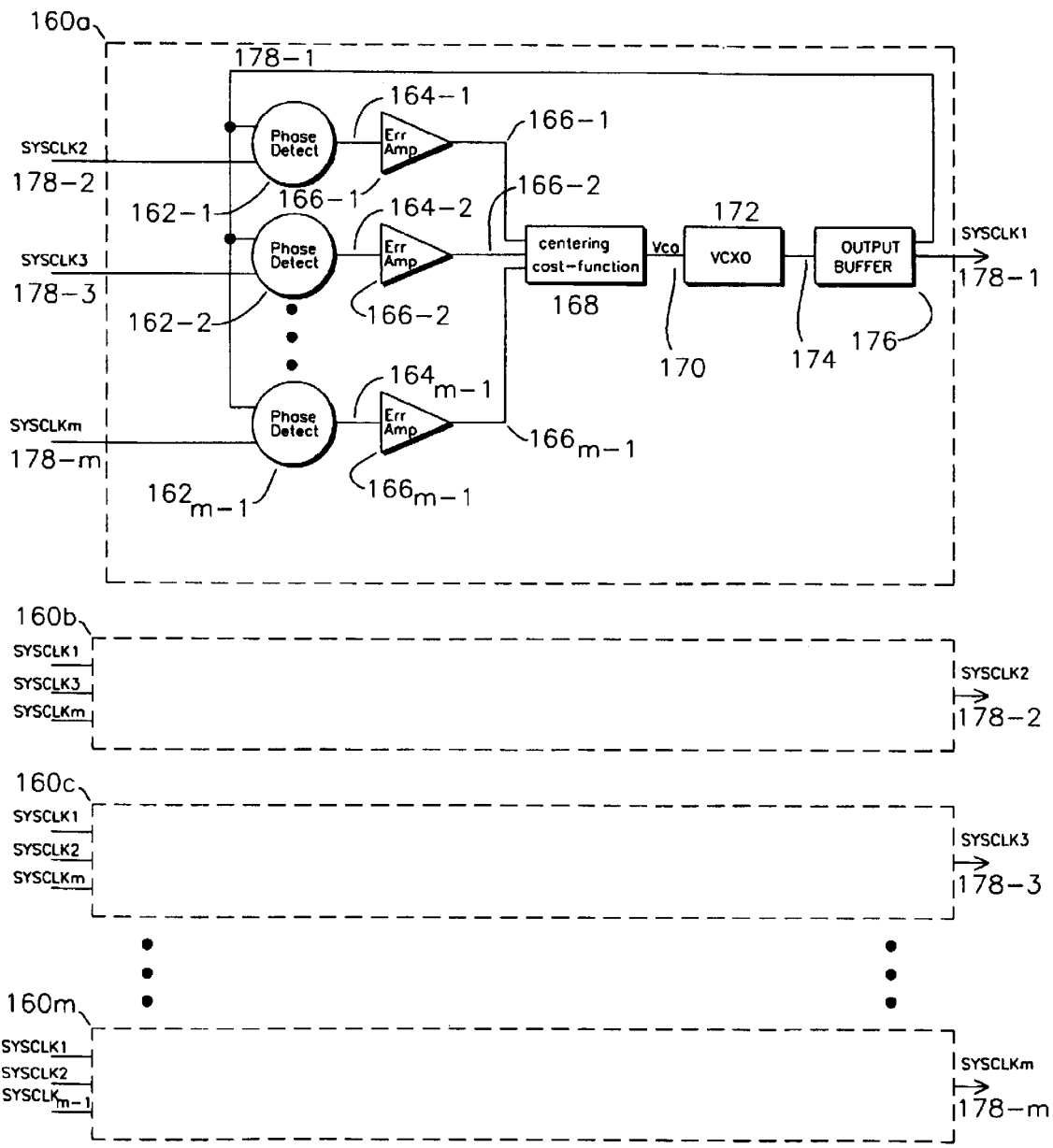

REDUNDANT CLOCK GENERATION AND DISTRIBUTION

FIELD OF THE INVENTION

This invention is directed to the class of redundant clock generation where a plurality of phase synchronous clocks is distributed to a plurality of loads, whereby a failure in or removal of one clock source does not effect the operation of the system.

BACKGROUND OF THE INVENTION

There are many prior art methods of generating and selecting a clock for use in a system with redundant clock sources. In one class of redundant clock generation, no attempt is made to directly synchronize the plurality of available clock sources. Instead, a post-clock synchronizer circuit is provided to maintain clock phase. Examples of this type of system include U.S. Pat. No. 5,522,915 by Byers et al, which identifies the synchronizer as elements 64 and 66 of FIG. 3 of this reference. U.S. Pat. No. 5,570,397 by Kubista discloses non-locked oscillators, a phase comparison circuit, and a pair of synchronizers which modify the respective oscillator inputs to produce a pair of synchronized clock outputs. U.S. Pat. No. 5,371,764 by Gillingham et al includes a variable delay element for adjusting the phase of the secondary clock.

Another class of clocking system relies on a master-slave relationship between the oscillators. In this topology, one of the clock sources is selected as the master, and the other the slave, which phase locks to the selected master. The roles of master and slave may reverse according to external control signals. U.S. Pat. No. 4,282,493 by Moreau is one such example. The slave oscillator tracks the master oscillator with a minimum of phase error. In the event that the master is determined to be defective, the defective master oscillator may be disabled, and the slave may replace the defective master for output signals. Another example of a master slave topology is U.S. Pat. No. 5,355,090 by Pajowski discloses Master Clock oscillators MC1 and MC2, and Phase Correctors PC1 and PC2 operate to track either MC1 or MC2, according to control signals provided by a microprocessor.

Another class of clock generation circuits produces a plurality of phase locked signals without a master-slave relationship, where a plurality of oscillator sources are cross-coupled to produce a plurality of phase coherent signals. One example of such a system is described in U.S. Pat. No. 5,557,623 by Discoll, and another example is U.S. Pat. No. 4,779,008 by Kessels. Both references disclose an oscillator having variable delay elements and phase alignment circuitry for adjusting the frequency and phase to a phase coherent state.

OBJECTS OF THE INVENTION

A first object of the invention is to provide a clock generation circuit comprising a plurality of oscillators which lock in phase to each other and also operate at the center frequency of the oscillator. A second object of the invention is to provide a clock selection circuit which provides for transient-free clock switchover.

SUMMARY OF THE INVENTION

In a first embodiment, a local clock circuit and a remote clock circuit are cross coupled. The local and remote clock circuits are identical in internal design and function, so any clock circuit may be observed from the perspective of a local clock circuit. Each clock circuit comprises a voltage controlled oscillator (VCO) coupled to a phase comparator producing a phase error proportional to the phase difference between the local oscillator and the remote oscillator. This local phase error is then processed by a cost function, which produces a control voltage provided to a local voltage controlled oscillator. The cost function comprises a linear combination of three error terms: a first phase error multiplied by a phase error gain, a second deviation from center frequency error multiplied by a deviation gain, and a third temporally varying offset. The cost function may be a linear or non-linear combination of these terms, and produces a control output for use by the voltage controlled oscillator.

In another embodiment, a local clock oscillator may be cross-coupled to a plurality of remote clock oscillators. As before, each clock oscillator comprises a voltage controlled oscillator coupled to a plurality of phase comparators, each producing a phase error proportional to the phase difference between the local oscillator and each of the remote oscillators. This local phase error is then processed by a cost function, which produces an error voltage provided to the local voltage controlled oscillator. The cost function comprises a linear combination of each phase comparator phase error term multiplied by a phase error gain, the deviation from center frequency, multiplied by a deviation gain, and a variable offset. The cost function may be a linear or non-linear combination of these terms.

BRIEF DESCRIPTION OF THE DRAWINGS

FIG. 1 shows the block diagram for a prior art master/slave clock generation system.

FIG. 2 shows the block diagram for a prior art frequency averaging clock generation system.

FIG. 3 shows the block diagram for a cost function clock generation system having two oscillators.

FIG. 4 shows a cost function.

FIG. 5 shows a clock select circuit.

FIG. 6 shows the timing for the clock select circuit of FIG. 5.

FIG. 7 shows the clock generation oscillator in a backplane configuration.

FIG. 8 shows the block diagram for an N-way cost function clock generation system.

DETAILED DESCRIPTION OF THE INVENTION

Modern high-speed digital circuits typically have synchronous clocking circuits, whereby a series of circuits are simultaneously clocked from a single clock source. There are many ways of practicing synchronous clocking, as detailed in "Digital Design: Principles and Practices" by John Wakerly (Prentice Hall). In high-availability, high reliability systems such as those used in the core of high speed networks, a synchronous system clock is often generated in one location and distributed to a plurality of remote locations. For redundant systems, this clock is generated in a plurality of locations, and distributed to the boards of a system which consume this clock. For the case of periodic failure, or the more likely scenario of routine maintenance and upgrade, it is desired to have the system switch clock sources in an uninterrupted manner. For this purpose, it is desired to produce multiple copies of a system clock that are phase and frequency synchronous to each other.

FIG. 1 shows the prior art master-slave clock synchronization circuit of U.S. Pat. No. 5,355,090 by Pajowski. Clock Source A 4 and Clock Source B 6 are typically located on different boards. Each Clock source is identical in circuitry. Clock Source A 4 comprises a free-running Master Clock A 10 and a Phase Corrector A 12, comprising a selector 14 having a select input 19, and a phase locked loop 16 which is capable of replicating an input clock furnished from the selector 14. Similarly, Clock Source B 6 comprises a free-running Master Clock B 20 and a Phase Corrector B 22, which further comprises a selector 24 having a select input 27, and a phase locked loop 26 for tracking the clock provided by selector 24. In operation, select input 28 is controlled by a CPU, and produces non-inverted select line 19 and inverted select line 27 via inverter 29. The select line 28 effectively selects which clock source A or B is master, making the non-master clock source the slave source. For example, if selector line 28 is high, selector 14 feeds Master Clock A to PLL 16, which produces MCLKA 18 tracking the frequency and phase of Master Clock A 10. Clock Source B selects MCLKA 18 as its input source, and PLL 26 replicates this clock, producing MCLKB. The phase delays from MCLKA to selector 24 and from MCLKB to selector 14 are carefully balanced so that MCLKA and MCLKB are very close to each other in phase. In practice, this type of system works quite well, and it is possible to achieve high degrees of phase and Frequency coherency between MCLKA 18 and MCLKB 8. However, it is impossible to get Master Clock A 10 and Master Clock B 20 to have exactly the same phase and frequency, so the purpose of PLL 16 and PLL 26 is to achieve a smooth transition during switchover times, and there is an intrinsic switchover transient related to the phase difference seen by the phase detector of the newly-activated PLL which sees the switchover in clock source as a frequency or phase transient. Also, it is inevitable that there will be a change in system clock frequency when the system clock changes from that of Master Clock A to that of Master Clock B upon switch over, since there is no mechanism to make master clock A and master clock B have the identical frequency or phase.

An alternate mechanism of synchronizing two oscillators is described in U.S. Pat. No. 4,779,008, where the oscillators all synchronize to each other without a specific master-slave relationship. The operation is described for the case of n=4 oscillators. FIG. 2 shows this configuration, which comprises 4 identical oscillator circuits 40, 62, 64, and 66. Each oscillator circuit accepts as input its own frequency output, as well as the surrounding oscillator frequencies. Examining one such oscillator 40 in detail, it can be seen that a phase locked loop 60 comprises a phase detector 52, an error amplifier 56, and a voltage controlled oscillator 58, which produces an output 42. A select circuit 54 successively provides the input frequencies of the output 42 of the present oscillator 40, as well as those of the other oscillators 62, 64, and 66 by changing the selected source through control 51 of multiplexer 50. Each interval of selection provided by select line 51 is chosen to be long with regard to the phase error measurement time of the phase detector 52, but short with regard to the phase lock loop 60 tracking time. In this manner, all of the oscillators tend to steer towards a central frequency. The large number of oscillator circuits tends to create a large error signal for the oscillator with an intrinsic center frequency which is different from the mean of the other oscillators. For the case where the standard deviation in oscillator center frequency is large, this type of circuit tends to translate large center frequency offsets into phase difference in the frequency synchronous generated outputs 42, 44, 46, and 48.

FIG. 3 shows the cost function clock generation of the present invention. Clock generator 61a is identical to clock generator 61b. Examining clock generation circuit 61a, there is a voltage controlled oscillator (VCO) 80a, which drives an output buffer 84a having at least 3 outputs. VCO 80a may be a voltage controlled crystal oscillator (VCXO), which is well known as of low phase noise source. An example of such a VCXO is #624Y4948@50 Mhz by Vectron, Inc. of Norwalk, Conn. A first output 62a is returned to the phase detector 64a, second output 88a distributes to the clock loads of the system, and third output 92a is fed back to the other clock generation circuit 61b as input signal 60b. The phase detector 64a is fed by the local clock 62a, as previously described, and the remote clock generator output 92b of the other clock generator 61b. A phase error is produced in phase detector output 68a, which is fed to error amplifier 70a, producing a compensated output 72a. A centering cost function 74a is applied to the output of error amplifier 72a, and this modified signal is input to the VCO 80a as an error signal 78a. Clock generator 61b operates in the same manner as just described, and for the case where there is no cost function present (Vo(78a)/Vi(72a)=1), the VCXOs 80a and 80b will track each other in frequency, although this frequency is indeterminate, as nothing constrains the synchronized frequency of operation until the VCXO 80a or 80b with the smaller control range saturates at its maximum or minimum frequency, after which the VCXO with the larger control range will track the saturated VCXO.

FIG. 4 shows a self centering cost function whereby input output signal $Vc_a$ 78a comprises input signal 72a multiplied by a constant $K1_a$ in multiplier 90a, and the result is added to offset $K2_a$ 94a. The subscript a for constants K1 and K2 indicates their location in clock generator 61a or 61b, and centering function 74b operates with the correspondingly same values, referenced as $K1_b$ 90b and offset $K2_b$ 94b.

Examining the transfer function of FIG. 3, and applying the cost function described in FIG. 4, we can write the following equations:

$$V_{ca} = K1_a G_a(s)(\theta_b - \theta_a) + K2_a$$

$$\theta_a = V_{ca} H_a(s)$$

$$\theta_a = K1_a G_a(s) H_a(s)(\theta_b - \theta_a) + H_a(s) K2_a$$

These two relationships produce the transfer function $$\Delta\theta_a / \Delta\theta_b = K1_a G_a(s) H_a(s) / (1 + K1_a G_a(s) H_a(s)).$$

examining the control voltages Vca and Vcb present at 78a and 78b respectively, we find $$Vc_a = K1_a G_a(s)(\theta_b - \theta_a) + K2_a$$

and $$Vc_b = K1_b G_b(s)(\theta_a - \theta_b) + K2_b$$

writing these two expressions in terms of the phase error, $$(\theta_b - \theta_a) = (Vc_a - K2_a)/K1_a G_a(s), \text{ and}$$

$$(\theta_b - \theta_a) = -(Vc_b - K2_b)/K1_b G_b(s).$$

If $K1_a G_a(s) = K1_b G_b(s)$, and $K2_a = K2_b$, then $$Vc_1 = -Vc_2,$$

and when $(\theta_b - \theta_a) = 0$ $Vc_a = K2_a$ $Vc_b = K2_b$

It is clear from these equations that the best setting for $K2_a$ and $K2_b$ is the center of the control range for $Vc_a$ and $Vc_b$, respectively, as this offers the largest dynamic range for control signals changing the frequency of the VCO up and down.

Examining the phase difference as a function of system constants, we find $$(\theta_b-\theta_a)=((\theta_a/H_a(s)-K2_a)/K1_aG_a(s)$$

For typical systems at DC, $H(0)=10^6$, so $\theta_a/H(0) \rightarrow 0$, which leaves us with $$(\theta_b-\theta_a)=(-K2_a)/K1_aG_a(s) \text{ and}$$

$$(\theta_b-\theta_a)=(-K2_b)/K1_bG_b(s).$$

Choosing large values for $K1_a$, $K1_b$, and $G(s)$ will accordingly keep the phase error $(\theta_b-\theta_a)$ quite small. These values could be reduced even further if the values for $K2_a$ and $K2_b$ were variable and derived from the measurement of offset voltages found at Vca and Vcb, rather than fixed values.

The selection of the phase detector for element 62a is important in cross-coupled systems such as this. Ordinarily, the choice of a ±2π phase detector is preferred in phase locked loops such as this application. ±2π phase detectors are ordinarily preferred because in a phase locked loop having a PLL with more than a factor of 2 of tuning range, it is possible for the phase detector to "false lock" at 2× the desired frequency, a failure for which the ±2π phase detector is immune. However, in a cross coupled system such as this, VCXOs are commonly used, and the tuning range for such an oscillator is only ±200 ppm typically. There is, however, a failure mechanism specific to ±2π phase detectors in cross coupled phase locked loops where one of the VCXOs will slightly lag the other in phase, but instead of detecting this as a slight phase lag, the phase detector will report a huge phase lead. This will cause both VCOs to increase in speed, until the VCO with the greater frequency control range saturates at the control rail. Thereafter, the trailing VCO is unable to phase advance over the saturated VCO, and this becomes the steady state. One means to overcome this lockup condition is the ability to temporarily force K1 to 0, which breaks the loop, and causes the VCXO to have a control voltage equal to K2, which is typically set to be at the center of the tuning range of the VCXO control voltage. If this is done as part of a power-up condition, the phase lag lockup problem is eliminated. The much simpler means of avoiding this lockup condition is to use a ±π in phase detector, which does not exhibit this problem at all. There are many ±π in phase detectors known in the art, the simplest example being an exclusive or gate, whereby the output is 0 when both inputs are 1(the in-phase condition), and the output is 1 whenever the inputs are different (the out-of-phase condition).

FIG. 5 shows the clock select circuitry 105, and is best understood in conjunction with FIG. 6 select timing. FIG. 5 shows one way to utilize system clocks SYSCLKA 88a and SYSCLKB 88b, along with the system clock good indicator signals SYSCLKA_GOOD 100a and SYSCLKB_GOOD 100b, and FIG. 6 shows the time relationship of these signals. SYSCLKA 88a and SYSCLKB 88b are input to a multiplexer 106, and SYSCLKA_GOOD 100a and SYSCLKB_GOOD 100b are the associated signals indicating that the associated SYSCLK is working or defective. Transitions on SYSCLKA_GOOD 100a and SYSCLKB_GOOD 100b are constrained to occur at least 1 propagation delay for gate 103 output SYSCLK_SEL 102 and multiplexer 106 before or after a SYSCLK (A or B) edge transition. SYSCLKA_GOOD 100a and SYSCLKB_GOOD 100b may be generated by the board responsible for the production of the clock signals, or it may be controlled by a central or redundant CPU, which may change the clocking over to the alternate clock phase when the system is experiencing a service interval, or when the primary clock generation circuitry is to be removed for repair or an upgrade. For this event, the SYSCLK_GOOD (100a or b) associated with, the board providing the clock would shut off, and the LOCAL_CLK 104 would select a new clock source without any switching transient. By constraining SYSCLK_GOOD (100a or b) to change before or after a propagation delay time, the LOCAL_CLK 104 switchover by multiplexer 106 occurs during a time when both SYSCLKA and SYSCLKB are either 1 or 0, since they are phase synchronous. FIG. 6 shows the SYSCLKA 88a and SYSCLKB 88b in phase, as provided by the clock generation circuit 61a, 61b. SYSCLKA_GOOD 100a and SYSCLKB_GOOD 100b are both active, meaning that either SYSCLK could be used. The switching circuit of FIG. 5 selects SYSCLKA 88a in this case, principally so that all boards in the system are operating on the same SYSCLK, which simplifies the number of different initial states required to perform complete failure testing, although it is clear that either SYSCLKA or SYSCLKB could be used interchangeably. FIG. 6 shows SYSCLKA_GOOD 100a deasserted at time 106, perhaps in response to a system request for a shutdown. Until time 106, LOCAL_CLK 104 was sourced by SYSCLKA 88a, and after time 106, it is provided by SYSCLKB 88b. At time 108, SYSCLKA 88a comes back on-line, as indicated by SYSCLKA_GOOD 100a. Thereafter, SYSCLKA is used to generate LOCAL_CLK, including time 110, where SYSCLKB_GOOD fails. In this manner, glitch-free switching is achieved in the production of LOCAL_CLK 104. It is clear to one skilled in the art that there are many different means for generating the selection of a LOCAL_CLK from a plurality of SYSCLKs which have been time synchronized, and there are a plurality of ways of generating SYSCLK_GOOD signals to govern their selection. The example shown here was chosen to show one way of generating SYSCLK_GOOD through the use of a CPU. Other ways of generating SYSCLK_GOOD include:

1) direct examination of SYSCLK (88a or b), and the If generation of SYSCLK_GOOD (100a or b) upon a detected failure in SYSCLK;
2) voting methods whereby SYSCLK_GOOD is determined from the comparison of a plurality of SYSCLK signals,
3) non-revertive methods whereby source switching does not occur merely upon the reassertion of a previously bad SYSCLK_GOOD 100a or b, but only at the moment that the selected SYSCLK_GOOD is deasserted. For example, in FIG. 6, interval 108, SYSCLKA 88a was revertively selected, even though there was nothing wrong with the previously selected SYSCLKB until time 110. In non-revertive switching, the selection to SYSCLKA would have been deferred until time 110.

FIG. 7 shows the arrangement of these elements in a backplane-based system, having a plurality of cards plugged into this backplane. Clock module A 61a and clock module B 61b are plugged into backplane 122, which distributes clock signals SYSCLKA 88a and SYSCLKB 88b to all of the boards in the system. In a typical system, these clock signals would be distributed as a plurality of point to point signals, rather than point to multi-point signals, as is the case for SYSCLKA_GOOD and SYSCLKB_GOOD, which are common to all of the cards of the system. In order to preserve the phase coherency of the local feedback clock signals 62a, 62b, as well as the remote feedback If clock signals 60a and 60b, all of these clock feedback trace lengths 60a, 60b, 62a, and 60b are the same length, and are the same length as each of the clock distribution lines SYSCLKA 88a and SYSCLKB 88b. System cards 1 120a through n 120n each consume one SYSCLKA 88a, one SYSCLKB 88b, and the common SYSCLKA_GOOD 100a and SYSCLKB_GOOD 100b. The clock selector logic 105a through 105n operates as described for FIG. 5. In this manner, when there is a maintenance shutdown, or a clock failure on either SYSCLKA 88a or SYSCLKB 88b, all of the LOCAL_CLK signals 104a through 104n switch over in a transient-free manner to the alternate clock as was described earlier.

FIG. 8 shows an N-way cost function clock generator comprising a plurality m of clock generators 160a through 160m. The first generator 160a is shown in detail for clarity. Each generator 160a through 160m produces one SYSCLK, noted as SYSCLK1 178-1 through SYSCLKm 178-m, and each clock generator uses the SYSCLK it locally generates, along with all of the other SYSCLKs, to produce an error signal. For example, the first clock generator 160a feeds back its own SYSCLK 178-1, and also connects to each SYSCLK2 through SYSCLKm from the surrounding clock generators. The phase error delivered to the centering cost function 168 comprises each phase error from phase detector 162-1 and error amplifier 166-1 through the last phase detector 162m-1 and error amplifier 166m-1. The cost function accepts each of these, and as described in FIG. 4, produces a Vca formed from a linear combination of each error amplifier 164-1 through 164m-1 multiplied by a constant K1, and this sum is added to an offset constant K2. The individual values of K1 applied to each phase detector may be different, or they may be the same, and the single offset value of K2 may be fixed in value, or it may vary independently for each clock generator.

I claim:

1. A redundant clock source comprising:
   a first and a second clock generator, each said clock generator having a system clock output and a system clock input, said first clock generator system clock output coupled to said second generator system clock input, said first generator system clock input coupled to said second generator clock output;
   each said clock generator comprising:
      a variable frequency oscillator having a control input and a clock frequency output, said output producing said system clock and a local clock, said oscillator output frequency controlled by said control input;
      a phase detector having a reference input coupled to said local clock, a remote input coupled to said system clock input, and an output proportional to the phase difference between said remote input and said reference input;
      an error amplifier coupled to said phase detector output and producing an error output signal from said phase detector output;
      a cost function generator coupled to said error amplifier output and producing said VCO control input by multiplying said error amplifier output by a first value, and adding a second value.

2. The clock generator of claim 1 wherein said oscillator is a voltage controlled crystal oscillator.

3. The clock generator of claim 1 wherein said phase detector operates linearly over the input difference angular range ±π.

4. The clock generator of claim 1 wherein said first value is a constant.

5. The clock generator of claim 1 wherein said first value varies over time.

6. The clock generator of claim 1 wherein said second value is a constant.

7. The clock generator of claim 1 wherein said second value varies over time.

8. The clock generator of claim 1 wherein said reference input and said remote input are equalized in phase delay from their respective sources.

9. The clock generator of claim 1 wherein said clock generator further includes a clock selection circuit for the selection of a local clock from said first and second system clock outputs, whereby said system clock outputs are accompanied by a first SYSCLK_GOOD signal and a second SYSCLK_GOOD signal, each said signal valid for a propagation time before and a propagation time after said system clock outputs change level, said circuit producing a local clock coupled to a switch selecting between said first system clock and said second system clock, said switch controlled by said SYSCLK_GOOD signals.

10. The clock generator of claim 9 whereby said switch changes to said first system clock if its associated signal SYSCLK_GOOD indicates it is operational.

11. The clock generator of claim 9 whereby said switch only changes to said first system clock if said second system clock becomes inoperational as indicated by associated said SYSCLK_GOOD.

12. An m-way redundant clock source comprising:
   a plurality m of clock generators, each said generator having a plurality m−1 of clock inputs and a single clock output, each said n clock generator outputs coupled to one of each said clock inputs on each of said m clock generator;
   each said clock generator comprising:
      a voltage controlled oscillator having a control input and producing a local clock output, a plurality m−1 of second clock outputs, each coupled to said clock generator output, and a varying number of system clock outputs, each said voltage controlled oscillator output in phase with each other;
      a plurality m−1 of phase detectors, each said phase detector having a first input coupled to said local clock and a second input coupled uniquely to one of every other m−1 clock generator second outputs, said phase detector producing a phase error proportional to the difference in phase between said second input and said first input;
      a plurality m−1 of error amplifiers, each said error amplifier uniquely coupled to each said phase detector output;
      a cost function having a plurality m−1 of inputs, each said input coupled uniquely to one of said error amplifier outputs, said cost function producing an output coupled to said control voltage, whereby said control voltage is a sum of products formed by multiplying each said m−1 error amplifier outputs by a plurality m−1 of first values, and thereafter adding a second value;
   where m is an integer greater than 2.

13. The clock generator of claim 12 wherein at least one said oscillator is a voltage controlled crystal oscillator.

14. The clock generator of claim 12 wherein at least one said phase detector operates linearly over the difference input angular range ±π.

15. The clock generator of claim 12 wherein at least one of first values is a constant.

16. The clock generator of claim 12 wherein at least one of said first values varies over time.

17. The clock generator of claim 12 wherein said second value is a constant.

18. The clock generator of claim 12 wherein said second value varies over time.

19. The clock generator of claim 12 wherein each said phase detector first input and said phase detector second input are equalized in phase delay from their respective sources.

20. The clock generator of claim 12 wherein said clock generator further includes a clock section circuit for the selection of a local clock from said system clock outputs, whereby each said system clock output is accompanied by a first SYSCLK_GOOD signal and a second SYSCLK_GOOD signal, each said signal valid for a propagation time before and a propagation time after said respective system clock outputs change state, said circuit producing a local clock coupled to a switch selecting between each said system clock, said switch controlled by said SYSCLK_GOOD signals.

21. The clock generator of claim 20 whereby said switch always changes to a different said system clock if its associated SYSCLK_GOOD signal indicate is operational.

22. The clock generator of claim 21 whereby said switch only changes to a different said system clock only if the selected system clock becomes inoperational.

\* \* \* \* \*